United States Patent
Fujii et al.

(10) Patent No.: US 9,379,465 B2
(45) Date of Patent: Jun. 28, 2016

(54) CONNECTION TERMINAL HAVING A PRESS-FITTING PART INSERTED INTO A HOLLOW PART OF A HOLDING MEMBER

(71) Applicant: NHK Spring Co., Ltd., Yokohama-shi (JP)

(72) Inventors: Takahiro Fujii, Kanagawa (JP); Koji Ishikawa, Kanagawa (JP); Jun Tominaga, Kanagawa (JP); Takayuki Katsuumi, Kanagawa (JP); Keiichi Ito, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 14/427,784

(22) PCT Filed: Sep. 13, 2013

(86) PCT No.: PCT/JP2013/074944
§ 371 (c)(1),
(2) Date: Mar. 12, 2015

(87) PCT Pub. No.: WO2014/042264
PCT Pub. Date: Mar. 20, 2014

(65) Prior Publication Data
US 2015/0255903 A1    Sep. 10, 2015

(30) Foreign Application Priority Data
Sep. 14, 2012    (JP) ................... 2012-203612

(51) Int. Cl.
*H01R 13/00* (2006.01)
*H01R 12/71* (2011.01)
(Continued)

(52) U.S. Cl.
CPC ............... *H01R 12/71* (2013.01); *H01L 25/07* (2013.01); *H01L 25/072* (2013.01); *H01L 25/18* (2013.01);
(Continued)

(58) Field of Classification Search
CPC ........ H01R 12/71; H01R 13/00; H01R 13/24; H01R 13/2407
USPC .......................... 439/482, 219, 889
See application file for complete search history.

(56) References Cited

U.S. PATENT DOCUMENTS

| 6,655,983 B1 * | 12/2003 | Ishikawa | G01R 1/07314 324/755.01 |
| 6,685,492 B2 * | 2/2004 | Winter | G01R 1/0466 324/754.08 |

(Continued)

FOREIGN PATENT DOCUMENTS

| DE | 10 2006 006 421 A1 | 8/2007 |
| EP | 1933380 B1 | 2/2010 |

(Continued)

OTHER PUBLICATIONS

International Search Report mailed Dec. 17, 2013, issued for PCT/JP2013/074944.

(Continued)

*Primary Examiner* — Chandrika Prasad
(74) *Attorney, Agent, or Firm* — Locke Lord LLP (57) ABSTRACT

A connection terminal for a power module, includes a conductive wire that is wound to form the connection terminal. The conductive wire includes an insertion part, at least a part of which is closely wound and to be inserted into a hollow part of a holding member of the power module, and includes a press-fitting part having a diameter larger than a diameter of the hollow part, a rough winding part in which the wire is wound at a predetermined interval, and a contact part for coming into contact with an external circuit, the contact pert being provided at an end part of the rough winding part on a side different from the end part on a side of the insertion part.

11 Claims, 8 Drawing Sheets

(51) Int. Cl.
  *H01R 12/73* (2011.01)
  *H01R 13/24* (2006.01)
  *H01L 25/07* (2006.01)
  *H01L 25/18* (2006.01)
  *H01L 23/00* (2006.01)

(52) U.S. Cl.
  CPC .............. *H01R 12/714* (2013.01); *H01R 12/73* (2013.01); *H01R 13/2407* (2013.01); *H01R 13/2421* (2013.01); *H01L 24/73* (2013.01); *H01L 2224/32225* (2013.01); *H01L 2224/48139* (2013.01); *H01L 2224/48227* (2013.01); *H01L 2224/49111* (2013.01); *H01L 2224/49175* (2013.01); *H01L 2224/73265* (2013.01); *H01L 2924/1305* (2013.01); *H01L 2924/13055* (2013.01)

(56) References Cited

U.S. PATENT DOCUMENTS

| | | | |
|---|---|---|---|
| 6,743,043 B2* | 6/2004 | Yamada | G01R 1/0483 324/756.02 |
| 7,626,408 B1* | 12/2009 | Kaashoek | G01R 1/06722 324/755.05 |
| 7,677,901 B1* | 3/2010 | Suzuki | G01R 1/0466 439/66 |
| 8,299,603 B2 | 10/2012 | Oka et al. | |
| 8,460,010 B2* | 6/2013 | Kimura | G01R 1/06722 439/66 |
| 8,523,579 B2* | 9/2013 | Johnston | H01R 13/2421 439/66 |
| 9,190,749 B2* | 11/2015 | Chen | H01R 12/714 |
| 2010/0117219 A1 | 5/2010 | Oka et al. | |

FOREIGN PATENT DOCUMENTS

| | | |
|---|---|---|
| JP | 2000-329790 A | 11/2000 |
| JP | 2003-100375 A | 4/2003 |
| JP | 2003-178848 A | 6/2003 |
| JP | 2008-153657 A | 7/2008 |
| WO | WO-2008/090734 A1 | 7/2008 |

OTHER PUBLICATIONS

Office Action dated Mar. 25, 2016, issued for the corresponding Chinese patent application No. 201380046653.7 and English translation thereof.

Supplementary European Search Report mailed May 2, 2016, issued for the correspodning European patent application No. 13 83 7865.

* cited by examiner

CONNECTION TERMINAL HAVING A PRESS-FITTING PART INSERTED INTO A HOLLOW PART OF A HOLDING MEMBER

FIELD

The present invention relates to a connection terminal for a power module used for the power module.

BACKGROUND

Conventionally, a power module including a semiconductor element for power control is known as a key device for energy saving used in a wide field from power control, for example, power control for industry and automobile, to motor control. The power module includes a substrate on which a plurality of semiconductor elements is mounted, and a plurality of connection terminals each of which is connected to each of the semiconductor elements to input and output power.

In the power module, the connection terminal is required to surely perform electric conduction between an external circuit substrate and a substrate of the power module. As such a connection terminal, it is disclosed that a connection terminal includes a first contact device which comes into contact with an electrode of a substrate in a pin shape, a second contact device which comes into contact with an external control circuit substrate in a curved shape, and an elastic part provided between the first contact device and the second contact device in a coil spring shape (for example, refer to Patent Literature 1). This connection terminal is inserted into a hole formed in a housing of the power module to be held.

CITATION LIST

Patent Literature

Patent Literature 1: Japanese Laid-open Patent Publication No. 2008-153657

SUMMARY

Technical Problem

However, in the related art described in the above-described Patent Literature 1, a load of the connection terminal depends on a compression force caused by the control circuit substrate. Therefore, when the control circuit substrate is deformed by vibration or the like, contact resistance between the connection terminal and the substrate and contact resistance between the connection terminal and the control circuit substrate may disadvantageously change.

The present invention has been accomplished in view of the above-described problem. An object of the present invention is to provide a connection terminal for a power module, which can maintain an excellent contact state stably.

Solution to Problem

To solve the above-described problem and achieve the object, a connection terminal for a power module according to the present invention is a part of the power module including: a semiconductor element; a substrate on which the semiconductor element is mounted; and a tubular conductive holding member which is joined to a surface of the substrate and extends in a direction perpendicular to the surface. The connection terminal electrically connects an external circuit to the substrate constantly by being held by the holding member, and is obtained by winding a conductive wire. The connection terminal includes: an insertion part, at least a part of which is closely wound and inserted into a hollow part of the holding member; a rough winding part in which the wire is wound at a predetermined interval; and a contact part which is provided at an end part of the rough winding part on a side different from the end part on a side of the insertion part, and comes into contact with the external circuit, and the insertion part includes a press-fitting part having a diameter larger than a diameter of the hollow part.

Moreover, in the above-described connection terminal for a power module according to the present invention, the press-fitting part is provided in a middle part in a winding direction.

Moreover, in the above-described connection terminal for a power module according to the present invention, the insertion part includes: a first insertion part which is provided at an end part and connected to the press-fitting part, and in which the wire is wound at a diameter smaller than that of the hollow part; and a second insertion part which is connected to an end part of the press-fitting part on a side different from the side connected to the first insertion part, and in which the wire is closely wound at a diameter smaller than that of the hollow part.

Moreover, in the above-described connection terminal for a power module according to the present invention, the press-fitting part includes one winding of the wire.

Moreover, the above-described connection terminal for a power module according to the present invention includes a diameter-enlarging part which is provided between the second insertion part and the rough winding part, and in which the wire is wound such that the diameter is enlarged in a tapered shape from an end part connected to the insertion part toward the rough winding part.

Moreover, in the above-described connection terminal for a power module according to the present invention, the wire is wound such that the diameter of the contact part is reduced in a tapered shape toward a tip.

Moreover, in the above-described connection terminal for a power module according to the present invention, at least a half winding of the wire of the contact part is on a same plane at an end part on a side in contact with the external circuit.

Moreover, in the above-described connection terminal for a power module according to the present invention, the wire is closely wound in the first insertion part.

Moreover, in the above-described connection terminal for a power module according to the present invention, the diameter of the first insertion part is reduced in a tapered shape from a side of the press-fitting part toward a tip.

Moreover, in the above-described connection terminal for a power module according to the present invention, the wire is wound at a predetermined interval in the first insertion part.

Advantageous Effects of Invention

According to the present invention, an insertion part, a rough winding part, and a contact part are included. In the insertion part, at least a part of a wire is closely wound, inserted into a holding member, and held by the holding member. In the rough winding part, the wire is wound at a predetermined interval. The contact part is provided at an end part of the rough winding part on a side different from an end part on the side of the insertion part and comes into contact with an external substrate. The insertion part includes a press-fitting part having a diameter larger than an inner diameter of the holding member. As a result, advantageously, an excellent contact state can be maintained stably.

DESCRIPTION OF EMBODIMENTS

Hereinafter, an embodiment of the present invention will be described in detail with reference to the drawings. The present invention is not limited by the following embodiment. In the drawings referred to in the following description, a shape, a size, and a positional relationship are only schematically illustrated such that the contents of the present invention can be understood. That is, the present invention is not limited only to the shape, the size, and the positional relationship illustrated in the drawings.

Figure 1:
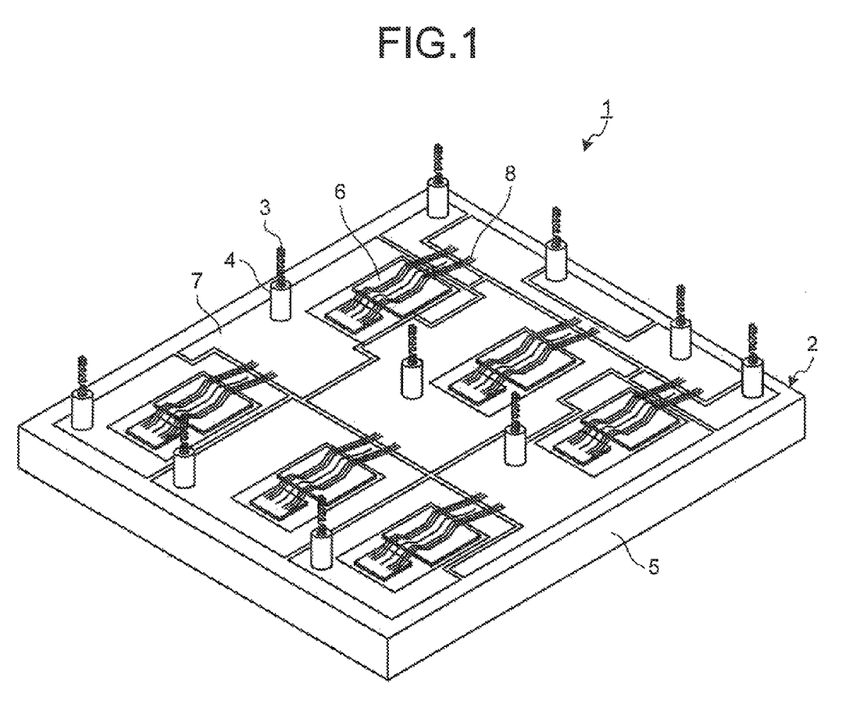
FIG. 1 is a perspective view illustrating a configuration of a power module according to an embodiment of the present invention.
Figure 2:
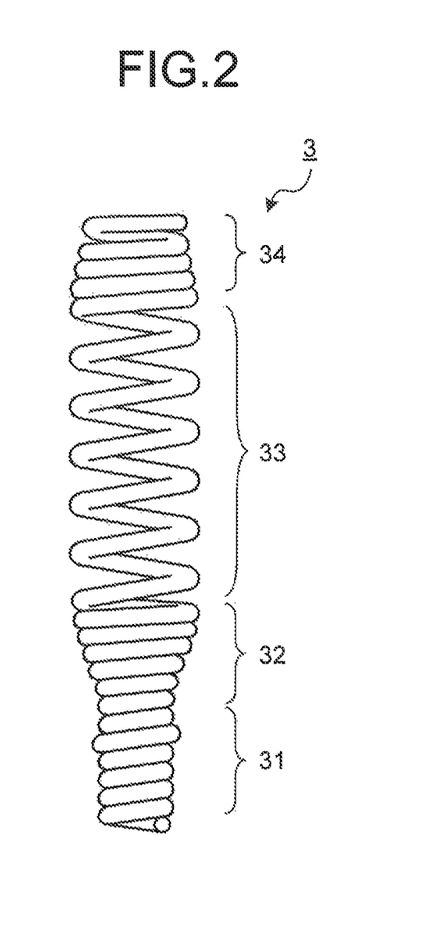
FIG. 2 is a schematic view illustrating a configuration of a connection terminal of the power module illustrated in FIG. 1.
Figure 3:
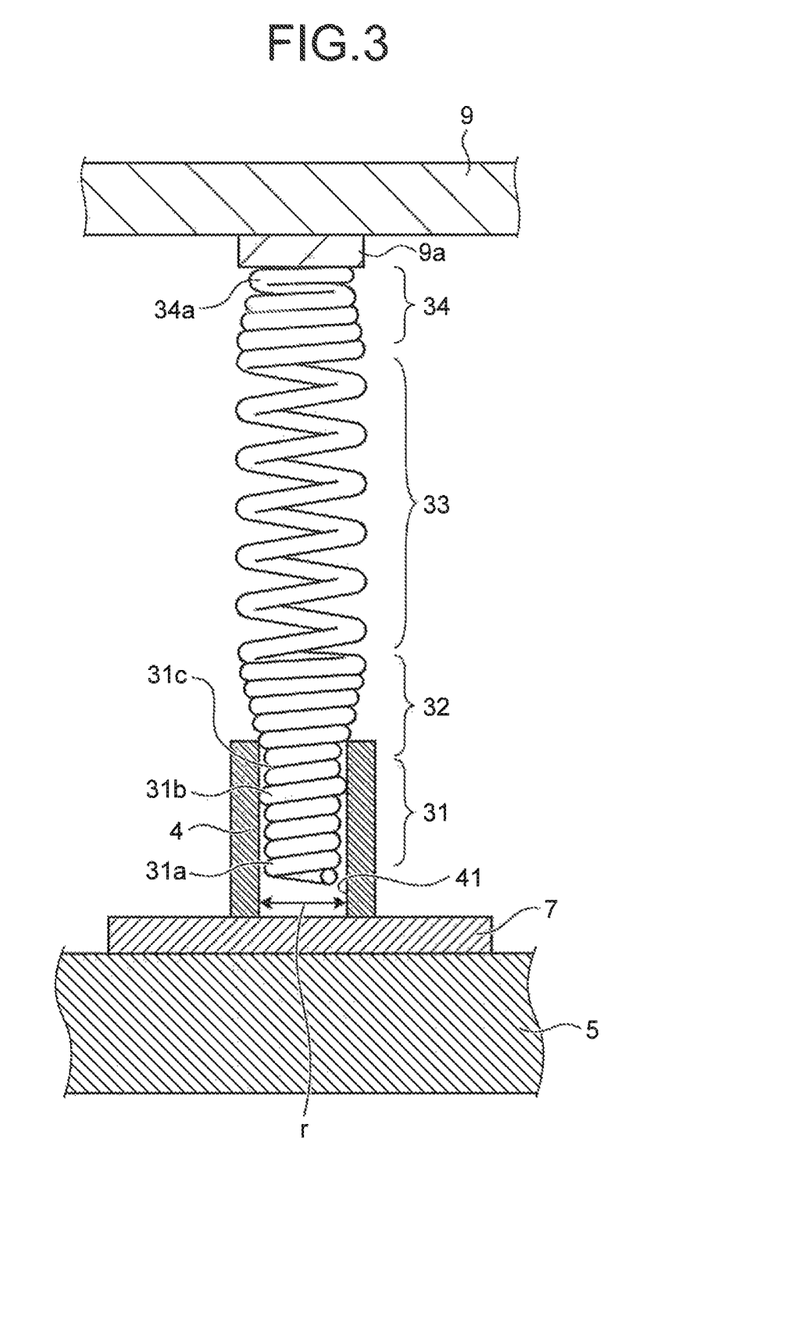
FIG. 3 is a view illustrating the power module according to the embodiment of the present invention, to which a substrate is attached.

FIG. 1 is a perspective view illustrating a configuration of a power module 1 according to the embodiment of the present invention. FIG. 2 is a schematic view illustrating a configuration of a connection terminal 3 of the power module 1 illustrated in FIG. 1. FIG. 3 is a view illustrating the power module 1 according to the present embodiment, to which a substrate is attached. The power module 1 illustrated in FIG. 1 includes a substrate 2, a conductive connection terminal 3, and a conductive holding member 4. A plurality of semiconductor elements is mounted on the substrate 2. The connection terminal 3 comes into electric contact with an external circuit, (control circuit substrate 9), and thereby electrically connects the circuit to the substrate 2 all the time. The holding member 4 is joined to a surface of the substrate 2, has a pillar shape extending in a direction perpendicular to the surface, and holds the connection terminal 3.

The substrate 2 includes a plate-like base material 5, a plurality of semiconductor elements 6, a plurality of electrodes 7, and a wire 8. The base material 5 includes an insulating resin or an insulating material such as ceramic. The semiconductor elements 6 are mounted on a main surface of the base material 5. The electrodes 7 are provided on the main surface of the base material 5. The wire 8 electrically connects the semiconductor element 6 to the electrode 7.

As a ceramic included in the base material 5, for example, a nitride ceramic such as aluminum nitride or silicon nitride, an oxide ceramic such as alumina, magnesia, zirconia, steatite, forsterite, mullite, titania, silica, or sialon, and a metal mainly including copper, aluminum, or iron can be applied. Among these, a nitride ceramic is preferable from a viewpoint of durability, thermal conductivity, or the like. When the base material 5 includes a metal, an insulating layer is formed on an external surface of the base material 5.

The semiconductor element 6 is one of power devices such as a diode, a transistor, and an insulated gate bipolar transistor (IGBT). In FIG. 1, any semiconductor element is described as "semiconductor element 6". However, these semiconductor elements 6 may be different from each other in type. The semiconductor element 6 is joined to the substrate 2 by soldering.

The electrode 7 is subjected to patterning using a metal such as copper or aluminum, or an alloy. As a result, the electrode 7 becomes a part of a circuit pattern for transmitting an electric signal to, for example, the semiconductor element 6 mounted on the substrate 2.

The connection terminal 3 is a coil spring in which a wire is wound in a substantially spiral shape. The connection terminal 3 includes an insertion part 31, a diameter-enlarging part 32, a rough winding part 33, and a contact part 34. In the insertion part 31, the wire is closely wound and inserted into a hollow part 41 of the holding member 4 to be closely fixed to the holding member 4. In the diameter-enlarging part 32, the wire extends from one end of the insertion part 31, and is closely-wound such that the diameter is enlarged in a tapered shape from an end part connected to the insertion part 31. In the rough winding part 33, the wire extends from an end part of the diameter-enlarging part 32 on a side different from the end part connected to the insertion part 31, and is wound at a rougher pitch than those in the insertion part 31 and the diameter-enlarging part 32. In the contact part 34, the wire extends from an end part of the rough winding part 33 on a side different from the end part, connected to the diameter-enlarging part 32. In the contact part 34, the diameter is reduced in a tapered shape toward the tip, at which the contact part 34 comes into contact with the external control circuit substrate 9 (electrode 9a). The connection terminal 3 having the above-described configuration includes a conductive metal or alloy. Specifically, the connection terminal 3 includes a copper alloy such as phosphor bronze, chromium copper, beryllium copper, or Corson copper.

The central axes of windings of the insertion part 31, the diameter-enlarging part 32, the rough winding part 33, and the contact part 34 are identical to one another. At least the largest diameter of the outer diameters of the diameter-enlarging part 32 (for example, the diameter of the diameter-enlarging part 32 at the end part of the rough winding part 33) is larger than that of the hollow part 41 (such a diameter that, insertion into the hollow part 41 is not performed through press-fitting).

The holding member 4 is erected in a direction perpendicular to a surface of the electrode 7 on the substrate 2. The holding member 4 includes a metal or an alloy having a hollow cylindrical shape. The holding member 4 holds a part of the insertion part 31 of the connection terminal 3 coming into close contact with the hollow part 41 which is a hollow space having a cylindrical shape. The holding member 4 is joined to the electrode 7 by soldering or the like.

When the connection terminal 3 is fixed to the holding member 4, the insertion part 31 is inserted into the hollow part 41, and a part of the insertion part 31 is press-fitted. As a result, the connection terminal 3 is fixed to the holding member 4. In this manner, the connection terminal 3 is attached to the power module 1.

The control circuit substrate 9 is attached to the power module 1. As a result, the holding member 4 and the electrode 9a of the control circuit substrate 9 are electrically connected to each other via the connection terminal 3 (refer to FIG. 3). At this time, the rough winding part 33 is elastically deformed against a load from the outside (control circuit substrate 9) to absorb the load.

Figure 4:
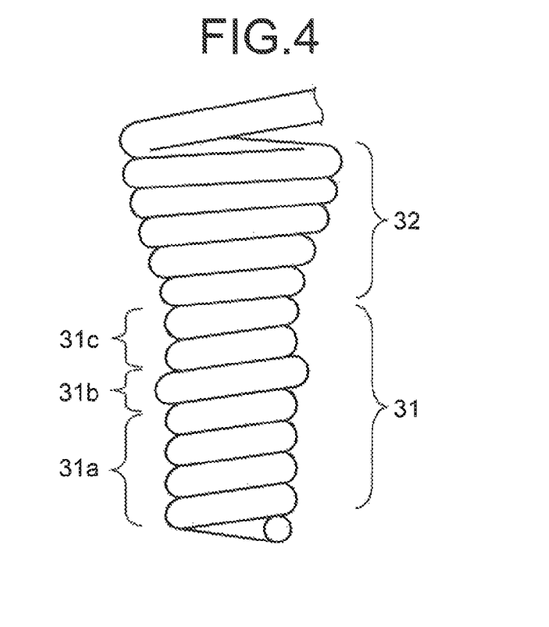
FIG. 4 is a schematic view illustrating a configuration of a main part of the connection terminal illustrated in FIG. 2.
Figure 5:
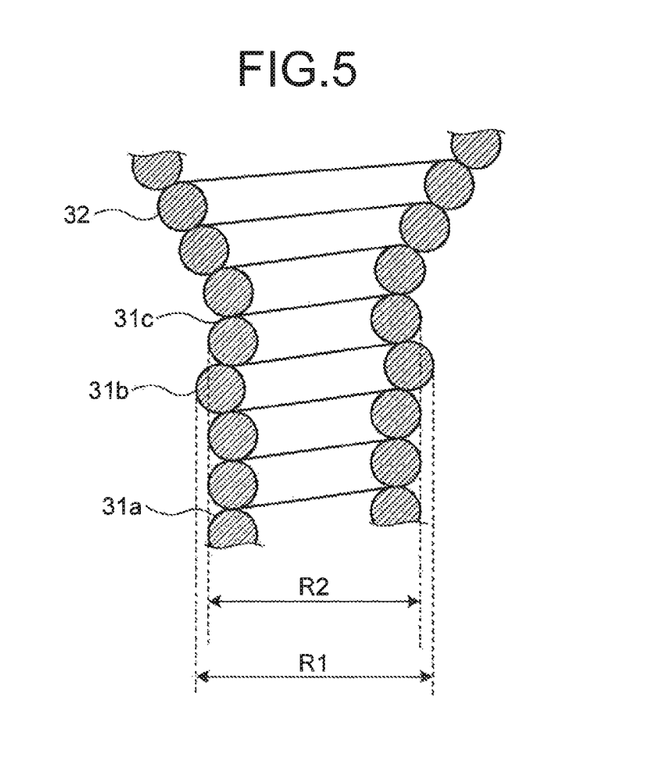
FIG. 5 is a cross-sectional view illustrating a configuration of a main part of the connection terminal illustrated in FIG. 2.

FIG. 4 is a schematic view illustrating a configuration of a main part of the connection terminal 3 illustrated in FIG. 2. FIG. 5 is a cross-sectional view illustrating the configuration of the main part of the connection terminal 3 illustrated in FIG. 2, and the cross-sectional view in the vicinity of the connection part between the insertion part 31 and the diameter-enlarging part 32. The cross-sectional view in FIG. 5 is obtained by cutting the connection terminal 3 at a plane passing through the central axis of winding of the connection terminal 3.

As illustrated in FIGS. 4 and 5, the insertion part 31 includes a first insertion part 31a, a press-fitting part 31b, and a second insertion part 31c. The first insertion part 31a is provided at an end part. In the first insertion part 31a, the wire is closely wound at a diameter smaller than that of the hollow part 41 (an inner diameter of the holding member 4). The press-fitting part 31b is connected to the first insertion part 31a. In the press-fitting part 31b, the wire is wound at a diameter larger than that of the hollow part 41. The second insertion part 31c is connected to the press-fitting part 31b at one end and connected to the diameter-enlarging part 32 at the other end. In the second insertion part 31c, the wire is closely wound at a diameter smaller than that of the hollow part 41 or a diameter equivalent to that of the first insertion part 31a. In the presen, embodiment, the press-fitting part 31b includes one winding of the wire. A maximum diameter R1 of this winding is larger than a diameter r of the hollow part 41. In the present embodiment, the first insertion part 31a and the second insertion part 31c are wound at the same diameter. A winding diameter R2 thereof is smaller than the diameter r of the hollow part 41. In the press-fitting part 31b, the wire is closely wound at connection parts between the press-fitting part 31b and the first insertion part 31a and between the press-fitting part 31b and the second insertion part 31c.

When the insertion part 31 is inserted into the hollow part 41, the first insertion part 31a guides the insertion part 31 through the hollow part 41, and the press-fit ting part 31b is press-fitted into the hollow part 41. Thereafter, the second insertion part 31c is inserted into the hollow part 41. The hollow part 41 abuts on the diameter-enlarging part 32. As a result, the insertion of the connection terminal 3 into the holding member 4 is completed. As a result, the connection terminal 3 is positioned with respect to the holding member 4.

At this time, in the insertion part 31, only the press-fitting part 31b comes into contact with the hollow part 41 (an inner wall of the holding member 4). The first insertion part 31a and the second insertion part 31c are not in contact with the hollow part 41. The press-fitting part 31b is press-fitted into the hollow part 41. As a result, the winding shape of the wire of the connection terminal 3 as viewed from a longitudinal direction is an oval or a circle. The connection terminal 3 is in contact with the hollow part 41 at two points where the wire intersects with a major axis of this oval or on an outer peripheral surface of the circle. As a result, the connection terminal 3 comes into contact with the holding member 4 through the press-fitting part 31b to cause electric conduction. The diameter of the winding is preferably designed (controlled) such that contact is caused in the press-fitting part 31b at two points where the wire intersects with the major axis of the oval or on the outer peripheral surface of the circle.

When an electric signal is output from the control circuit substrate 9 to the substrate 2, in the connection terminal 3, the electric signal is transmitted from the control circuit substrate 9 to the contact part 34. Thereafter, the electric signal passes through the contact part 34, the rough winding part 33, and the diameter-enlarging part 32 to be transmitted to the second insertion part 31c of the insertion part 31. Then, the electric signal reaches the substrate 2 via the holding member 4 (hollow part 41) from the press-fitting part 31b. The wire is closely wound in the contact part 34, the diameter-enlarging part 32, the second insertion part 31c, and the press-fitting part 31b. As a result, inductance can be reduced.

The insertion part 31 is always in contact with the hollow part 41 at the two points of the press-fitting part 31b against the load from the outside. That is, the connection terminal 3 can always come into contact with the holding member 4 in a constant contact state not depending on the load from the outside.

Figure 6:
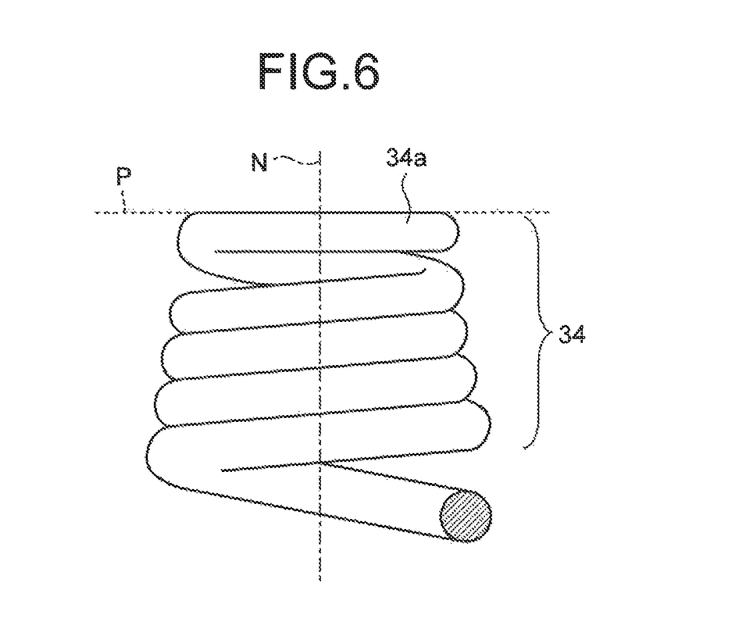
FIG. 6 is a schematic view illustrating a configuration of a main part of the connection terminal illustrated in FIG. 2.

FIG. 6 is a schematic view illustrating a configuration of a main part of the connection terminal 3 illustrated in FIG. 2. In an end part 34a of the contact part 34 on a side in contact with the electrode 9a of the control circuit substrate 9 illustrated in FIG. 6, at least a half winding of the wire at the tip is on a plane P. Here, the plane P in the present embodiment is perpendicular to a central axis N in a winding direction of the connection terminal 3. In the contact part 34, the wire is wound at intervals of winding in the end part 34a. The wire is closely wound in other parts than the end part 34a.

As a result, for example, when the electrode 9a has a plate shape, a contact area between the electrode 9a and the end part 34a can be larger than the contact area when the wire is wound in a spiral shape in the end part.

According to the above-described embodiment, in a part of the insertion part 31, the press-fitting part 31b in which the wire is closely wound at a diameter larger than that of the hollow part 41 is formed. Therefore, an excellent contact state can be maintained stably. The connection terminal 3 (press-fitting part 31b) is fixed to the holding member 4 (hollow part 41) through press-fitting. Therefore, contact between the connection terminal 3 and the holding member 4 can be stabilized without being influenced by vibration of the control circuit substrate 9 at the other end of the connection terminal 3. Furthermore, the press-fitting part 31b is inserted through press-fitting while scraping an inner wall surface of the hollow part 41. In this way, it is possible to remove an oxide film formed on the wall surface of the hollow part 41 to realize excellent electric conduction.

According to the above-described present embodiment, the diameter-enlarging part 32 is made to abut on the end part of the hollow part 41 to position the connection terminal 3 and the holding member 4. Therefore, the projection height of the connection terminal 3 in the power module 1 can be controlled.

Here, in the insertion part 31, the wire is closely wound. Therefore, the -wire of the insertion part 31 has high accuracy of winding diameter and high rigidity, and is suitable for pressure-fitting into the hollow part 41. The connection terminal 3 (press-fitting part 31b) comes into contact with the holding member 4 (hollow part 41) through press-fitting. As a result, the surface pressure between the connection terminal 3 and the holding member 4 is high to lower the contact resistance. Furthermore, the press-fitting part 31b corresponds to one winding. Therefore, a load required for press-fitting can be smaller than that in multiple windings. The control of the winding diameter of the press-fitting part 31b makes it possible to control the number of the contact points between the press-fitting part 31b and the hollow part 41.

In the diameter-enlarging part 32, the wire is closely wound. Therefore, it is possible to suppress destruction of the shape by a load when the connection terminal 3 is inserted into the holding member 4. That is, against the load when the connection terminal 3 is inserted, the shape of the connection terminal 3 can be kept more surely than in a case where the wire is roughly wound at a predetermined interval in the diameter-enlarging part 32. A setting effect in the connection terminal 3 can be obtained by the load when the connection terminal 3 is inserted into the holding member 4. The durability of the connection terminal 3 can be improved.

By adjusting the diameter-enlarging ratio in the diameter-enlarging part 32, an angle formed by a line segment connecting the adjacent wires of the diameter-enlarging part 32 and the central axis N in the winding direction of the connection terminal 3 can be adjusted. By adjusting this angle, the arrangement height of the diameter-enlarging part 32 is adjusted. As a result, the length of the connection terminal 3 in the direction of the central axis N can be adjusted. By optimizing this angle, the connection terminal 3 can be saved in space and improved in load resistance.

According to the above-described embodiment, in the end part 34a of the contact part 34, the wire is wound on the same plane over a half circumference. As a result, line contact in an area corresponding to the half circumference of the end part 34a to the electrode 9a of the control circuit substrate 9 can be caused. In this way, stable contact between the connection terminal 3 and the electrode 9a can be realized. Meanwhile, when the wire wound in a spiral shape is made to come into contact with the electrode 9a as in the related art, the tip of the wire may cut the electrode 9a to change the contact resistance.

In the description of the above-described embodiment, the press-fitting part 31b is assumed to correspond to one winding. However, the press-fitting part 31b may include two windings or three windings. At this time, in order to keep the contact state constant regardless of the load, the press-fitting part 31b is preferably in contact with the hollow part 41 at the small number of winding. When the wire is wound multiple times, the wire is preferably closely wound.

The press-fitting part 31b in the Insertion part 31 can be arranged at any position in the insertion part 31. Here, the press-fitting part 31b is preferably at a position (middle part) other than the one winding at each end in the direction of the central axis N of the insertion part 31. In order to guide the insertion part 31 to the hollow part 41, the first insertion part 31a is preferably wound multiple times. In order to suppress the destruction of the connection terminal 3 through press-fitting while the diameter connected to the diameter-enlarging part 32 is continuous, the second insertion part 31c preferably includes one or more windings.

Figure 7:
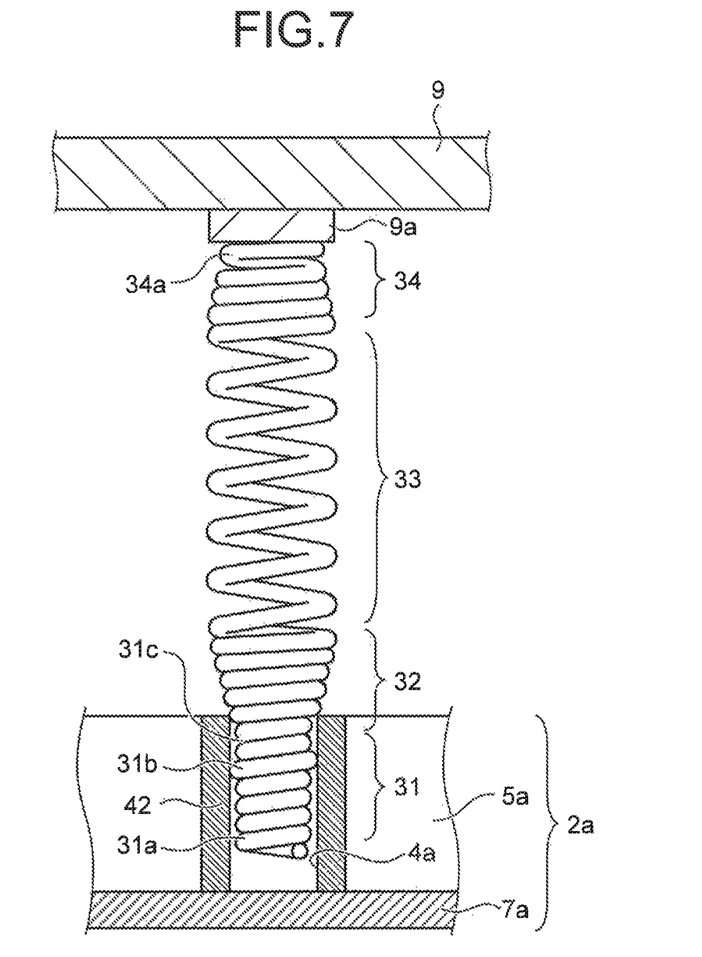
FIG. 7 is a partial cross-sectional view schematically illustrating a configuration of a main part of a power module according to a first modification example of the embodiment of the present invention.

In the description of the above-described embodiment, the connection terminal 3 is assumed to be inserted into the hollow part 41 of the holding member 4. However, instead of the holding member 4, a via may be formed in accordance with the arrangement position of the electrode 7 on the substrate 2 to insert the connection terminal 3 into the via. FIG. 7 is a partial cross-sectional view schematically illustrating a configuration of a main part of a power module according to a first modification example of the present embodiment. In a base material 5a of a substrate 2a illustrated in FIG. 7, a via 4a is formed. The via 4a is provided in accordance with an electrode 7a formed on the surface of the base material 5a, and passes through the base material 5a in the plate thickness direction thereof. In the inner surface of the via 4a, tubular conductive internal wiring 42 connected to the electrode 7a is formed. At this time, an inner periphery (corresponding to the diameter of the hollow part) of the internal wiring 42 is r, which is a diameter equivalent to that of the above-described hollow part 41. The above-described connection terminal 3 is inserted into the internal wiring 42. As a result, the press-fitting part 31b is press-fitted into the internal wiring 42 to cause electric conduction between the connection terminal 3 and the electrode 7a.

Figure 8:
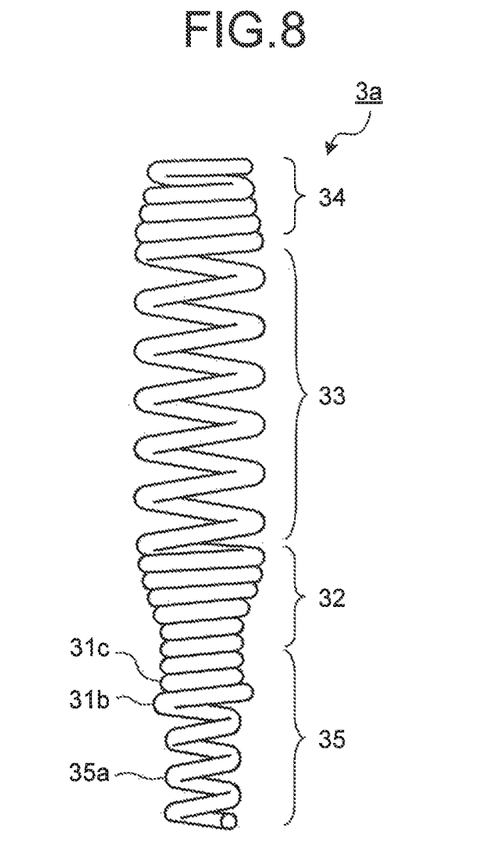
FIG. 8 is a schematic view illustrating a configuration of a connection terminal of a power module according to a second modification example of the embodiment of the present invention.

FIG. 8 is a schematic view illustrating a configuration of a connection terminal 3a of a power module 1 according to a second modification example of the present embodiment. The same signs are attached to the same components as those of the connection terminal 3 described above in FIG. 1 or the like. In the description of the above-described embodiment, the first insertion part 31a is assumed to be closely wound. However, as illustrated in FIG. 8, an insertion part 35 may be provided, the insertion part 35 including a first insertion part 35a in which the wire is roughly wound at a predetermined pitch.

As a result, when a load is applied to the press-fitting part 31b, the first insertion part 35a is deformed, and thereby the load can be released to the outside. For example, when the load is applied to the press-fitting part 31b and the diameter thereof is reduced, the diameter of the first insertion part 35a is enlarged. Therefore, it is possible to suppress application of an extra load to the press-fitting part 31b. The connection terminal 3a can be fixed to the holding member 4 or the via 4a more appropriately.

Figure 9:
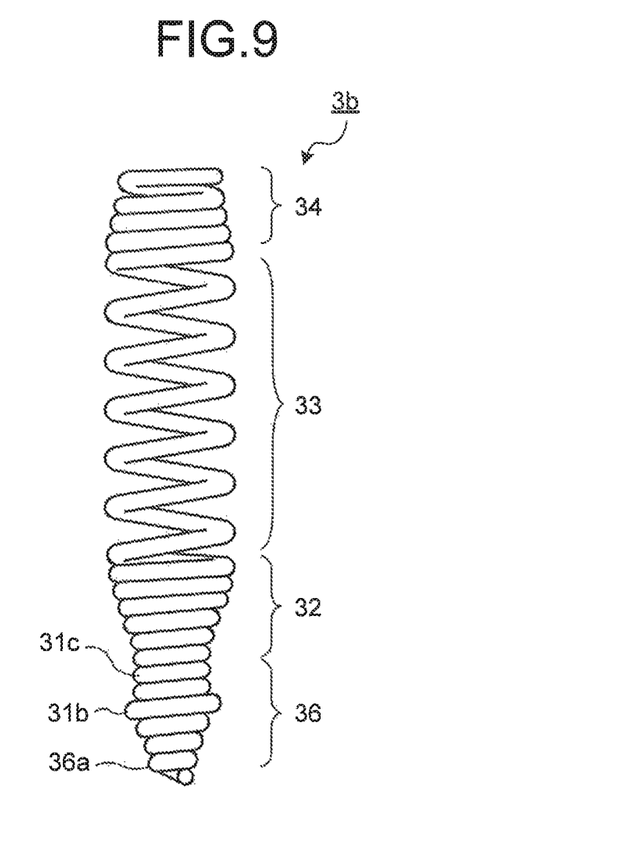
FIG. 9 is a schematic view illustrating a configuration of a connection terminal of a power module according to a third modification example of the embodiment of the present invention.

FIG. 9 is a schematic view illustrating a configuration of a connection terminal 3b of a power module 1 according to a third modification example of the present embodiment. The same signs are attached to the same components as those of the connection terminal 3 described above in FIG. 1 or the like. In the description of the above-described embodiment, in the first insertion part 31a, the wire is assumed to be wound at the same diameter. However, as illustrated in FIG. 9, an insertion part 36 may be provided, the insertion part 36 including a first insertion part 36a in which the wire is wound so as to reduce in size in a tapered shape toward the tip.

As a result, when inserted into the hollow part 41 or the internal wiring 42, the connection terminal 3b can be inserted into the hollow part 41 or the internal wiring 42 more easily to dispose the connection terminal 3b in the holding member 4 or the via 4a.

In the present invention, a portion from the surface of the substrate to the height in accordance with the disposition position of the control circuit substrate may be sealed with a resin. As such a resin, for example, an epoxy resin filled with silica powder as a filler can be applied. In this case, an insertion hole into which a connection terminal is inserted is formed in the resin.

As described above, the present invention can include various embodiments and the like not described here. Various design changes or the like can be made within a scope not departing from the technical idea specified by the claims.

INDUSTRIAL APPLICABILITY

As described above, the connection terminal for a power module according to the present invention is useful for stably maintaining an excellent contact state.

REFERENCE SIGNS LIST 1 power module
2, 2a substrate 3, 3a, 3b connection terminal
4 holding member
4a via
5, 5a base material
6 semiconductor element
7 electrode
8 wire
31 insertion part
31a, 35a, 36a first insertion part
31b press-fitting part
31c second insertion part
32 diameter-enlarging part
33 rough winding part
34 contact part
34a end part
41 hollow part
42 internal

The invention claimed is:

1. A connection terminal for a power module, the connection terminal being a part of the power module including: a semiconductor element; a substrate on which the semiconductor element is mounted; and a tubular conductive holding member which is joined to a surface of the substrate and extends in a direction perpendicular to the surface, the connection terminal electrically connecting an external circuit to the substrate constantly by being held by the holding member, the connection terminal being obtained by winding a conductive wire, the connection terminal comprising:
an insertion part, at least a part of which is closely wound and inserted into a hollow part of the holding member;
a rough winding part in which the wire is wound at a predetermined interval; a diameter-enlarging part connected between the insertion part and the rough winding part; and
a contact part which is provided at an end part of the rough winding part on a side different from the end part on a side of the insertion part, and comes into contact with the external circuit,
wherein the insertion part includes a press-fitting part having a diameter larger than a diameter of the hollow part.

2. The connection terminal for a power module according to claim 1, wherein the press-fitting part is provided in a middle part of the insertion part in a winding direction.

3. The connection terminal for a power module according to claim 1, wherein the insertion part comprises:
a first insertion part which is provided at an end part and connected to the press-fitting part, and in which the wire is wound at a diameter smaller than that of the hollow part; and
a second insertion part which is connected to an end part of the press-fitting part on a side different from the side connected to the first insertion part, and in which the wire is closely wound at a diameter smaller than that of the hollow part.

4. The connection terminal for a power module according to claim 3, wherein the press-fitting part includes one winding of the wire.

5. The connection terminal for a power module according to claim 3, comprising the diameter-enlarging part which is provided between the second insertion part and the rough winding part, and in which the wire is wound such that the diameter is enlarged in a tapered shape from an end part connected to the insertion part toward the rough winding part.

6. The connection terminal for a power module according to claim 1, wherein the wire is wound such that the diameter of the contact part is reduced in a tapered shape toward a tip.

7. The connection terminal for a power module according to claim 1, wherein at least a half winding of the wire of the contact part is on a same plane at an end part on a side in contact with the external circuit.

8. The connection terminal for a power module according to claim 3, wherein the wire is closely wound in the first insertion part.

9. The connection terminal for a power module according to claim 8, wherein the diameter of the first insertion part is reduced in a tapered shape from a side of the press-fitting part toward a tip.

10. The connection terminal for a power module according to claim 3, wherein the wire is wound at a predetermined interval in the first insertion part.

11. A connection terminal for a power module, comprising:
a conductive wire that is wound to form the connection terminal, the conductive terminal comprising
an insertion part, at least a part of which is closely wound and to be inserted into a hollow part of a holding member of the power module, and includes a press-fitting part having a diameter larger than a diameter of the hollow part,
a rough winding part in which the wire is wound at a predetermined interval, a diameter-enlarging part connected between the insertion part and the rough winding part; and
a contact part for coming into contact with an external circuit, the contact pert being provided at an end part of the rough winding part on a side different from the end part on a side of the insertion part.

* * * * *